United States Patent [19]

Curtice

[11] 4,166,965

[45] Sep. 4, 1979

[54] THRESHOLD GATE

[75] Inventor: Walter R. Curtice, West Windsor, N.J.

[73] Assignee: RCA Corporation, New York, N.Y.

[21] Appl. No.: 856,794

[22] Filed: Dec. 2, 1977

[51] Int. Cl.$^2$ ............................................... H03K 3/64
[52] U.S. Cl. ................................. 307/299 R; 307/251; 331/107 G
[58] Field of Search .................. 331/107 G; 307/248, 307/299, 317, 251

[56] References Cited

U.S. PATENT DOCUMENTS

| | | | |
|---|---|---|---|
| 3,493,842 | 2/1970 | Robrock | 331/107 G |
| 3,603,818 | 9/1971 | White | 331/107 G |
| 4,000,415 | 12/1976 | Curtice | 307/299 R |

*Primary Examiner*—Martin H. Edlow
*Assistant Examiner*—B. P. Davis
*Attorney, Agent, or Firm*—H. Christoffersen; Joseph D. Lazar; Raymond E. Smiley

[57] ABSTRACT

A transferred electron logic input device (TELD) is cascaded with a field effect transistor output device (FET) to provide a threshold gate having switching times compatible with gigabit rate logic and having the capability to drive low impedance loads.

13 Claims, 3 Drawing Figures

THRESHOLD GATE

The Government has rights in this invention pursuant to Contract No. N00039-75-C-0225 awarded by the Department of the Navy.

BACKGROUND OF THE INVENTION

1. Field of the Invention

The present invention relates to threshold circuits and in particular to threshold gates suitable for operation with subnanosecond pulses.

2. Description of the Prior Art

A threshold gate is an electronic circuit receptive of input signals for producing an output signal at one value so long as the input signal is below some predetermined value. When the input signal rises above the predetermined value, the output signal changes to a different value within some time, $\Delta t$, thereafter and remains there for a predetermined time. Many such threshold circuits exist where $\Delta t$ is in the nanosecond range or greater. Few threshold gate circuits exist, however, for use with input signals in the subnanosecond range. The principle example is the avalanche transistor. G. F. Ross in an article entitled "The Accurate Measurement of Range by the Use of Microwave Delay Line Techniques," in IEEE Trans. on Micro-Wave Theory and Tech., vol. MTT-23, No. 12, Dec. 1975, pp. 1071–1075, has demonstrated threshold circuits constructed with avalanche transistors. These devices have large package delays and poor threshold characteristics for some applications.

A transferred-electron device with a Schottky-barrier gate known as a TELD has excellent threshold properties and is capable of operation at frequencies having a subnanosecond period. A TELD is not, however, well suited to drive low impedance loads while providing gain. Although an impedance matching transformer can be designed to operate at any given frequency, it does not operate as required for fast rise time pulses. Therefore, an impedance matching transformer is not suitable for cascading in a TELD gate circuit to drive low impedance loads.

SUMMARY OF THE INVENTION

A TELD, normally biased below threshold, is receptive of an input signal above some given value for triggering domain formation. The TELD is coupled in cascade with an active device for producing a load driving signal at a first level when the TELD is not in the domain forming mode and producing a signal at a second level when the TELD is in the domain forming mode. The active device is of the type in which $G_m > 1 \div R_L$, where $G_m$ is the transconductance of the active device and $R_L$ is the resistance of the load driven by the device.

DETAILED DESCRIPTION OF THE PREFERRED EMBODIMENT

Figure 1:
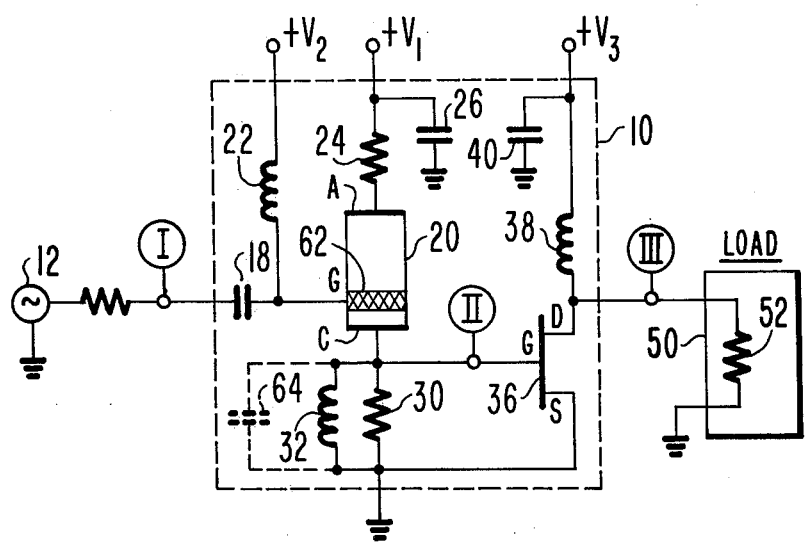
FIG. 1 is a monostable threshold gate circuit in accordance with the present invention.
Figure 2:
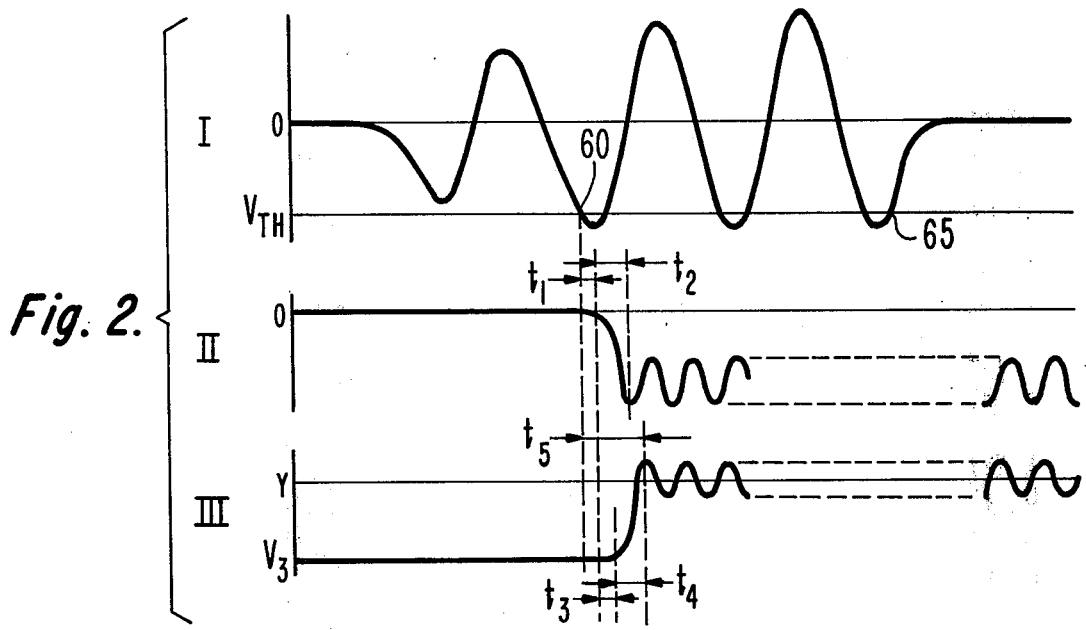
FIG. 2 is a set of three waveforms useful in understanding the operation of the circuit of FIG. 1.

Referring to FIG. 1, a threshold gate circuit 10 has coupled at its input terminal I a signal source 12. With reference to FIG. 2, where waveform numbers correspond to terminal numbers in FIG. 1, threshold circuit 10 produces an output signal of one value, $V_3$, at terminal III when the input signal at terminal I is below (in magnitude) some preselected threshold value $V_{th}$. Conversely, when the input signal at terminal I goes above (in magnitude) value $V_{th}$, even briefly, threshold gate 10 produces at terminal III an oscillatory signal having an average value Y greater than $V_3$ which can be made to persist for a time on the order of 10 nanoseconds even if the input signal at terminal I drops below the threshold value.

Returning to FIG. 1, terminal I is A.C. coupled via coupling capacitor 18 to the gate (G) terminal of a transferred electron logic device (TELD) 20. Also coupled to the gate terminal is a gate bias source $V_2$ via an inductive choke 22. The anode of TELD 20 is coupled via resistor 24 to a bias source $V_1$. A noise suppression capacitor 26 is also coupled between the bias source $V_1$ and a source of reference potential such as ground. The cathode (C) of TELD 20 is coupled in parallel to a load resistor 30 and an inductive choke 32 which are, in turn, coupled to a source of reference potential such as ground. The values of $V_1$ and resistor 24 are such that the anode-to-cathode voltage differential of TELD 20 is about 90% of the voltage differential which causes domain formation in TELD 20. Resistor 24 and resistor 30 are chosen such that their sum is at least equal to $R_o$ (where $R_o$ is the low-field resistance, anode-to-cathode of TELD 20) and no larger than several times $R_o$. This requirement provides a load line for TELD 20 such that upon current reduction due to domain triggering, the anode-to-cathode voltage differential becomes large enough to sustain a travelling domain. The choice of resistor 24 and resistor 30 depends upon the desired quiescent operating condition of TELD 20, the desired triggering sensitivity, and the choice of RC time constant for the cathode circuit. The use of choke 22 permits use of D.C. bias from D.C. source $V_2$ to be applied directly to TELD 20 gate while providing essentially an infinite impedance to high frequency signals applied at terminal I. Likewise inductor 32 provides infinite impedance to high frequency signals at the cathode of TELD 20.

TELD 20 is coupled in cascade directly with an active device 36. Active device 36 having a transconductance $G_m$ is typically capable of driving a low impedance load of value $R_L$ while providing gain (i.e., $G_m \cdot R_L > 1$) and is capable of operating at subnanosecond speeds at which TELD 20 operates. A field effect transistor (FET) and more particularly, a type of FET known as a MESFET is preferably as active device 36. TELD 20 cathode is directly coupled at terminal II to the gate (G) of FET 36. The source (S) of FET 36 is coupled to a source of reference potential such as earth ground, while the drain (D) terminal is coupled via inductive choke 38 to a source of bias potential $V_3$. A noise suppression capacitor 40 is coupled between bias source $V_3$ and earth ground. The use of a choke 38 rather than a bias resistor (not shown) provides more gain in FET 36 with less power dissipation than with the use of a resistor.

The drain terminal of FET 36 is coupled to the output terminal III of threshold gate 10 which, in turn, is coupled to a load 50. Load 50 suitably comprises a relatively low impedance resistor 52 having a resistance $R_L$. Resistor 52 may take the form of a transmission line. Transmission lines typically have a characteristic impedance on the order of 50 or 100 ohms, or perhaps 200 ohms, all of which values are considered to be low impedance when compared to typical active device input impedances which are typically 1000 ohms or more.

Operation of the circuit of FIG. 1 is as follows. Bias supplies $V_1$ and $V_2$ are of values such that TELD 20 is biased to about 90% of the value required to cause domain formation. Bias current returns to ground through inductor 32. Therefore, in the absence of an input signal in excess of a preselected threshold voltage being applied at terminal I, the effective anode-to-cathode impedance of TELD 20 is relatively low (compared to the effective impedance when domain formation is occurring) and therefore the current through TELD 20 and consequently through inductor 32 is relatively high. With only D.C. bias passing through inductor 32, it exhibits substantially zero resistance. Consequently, the voltage drop across resistor 30, as applied to the gate of FET 36, is zero. The drain of FET 36 is biased through inductor 38 which functions as a load decoupling inductor. With a zero voltage applied to the gate of FET 36, the output terminal III at the drain is $V_3$.

When an input signal is applied to terminal I which does not go more negative than voltage $V_{th}$, the input voltage which triggers TELD 20 to domain formation, the circuit remains in what will hereinafter be known as the "OFF" or quiescent state, that is, with terminal II producing substantially zero voltage and terminal III consequently producing substantially $V_3$ voltage.

When the input signal exceeds (in magnitude) $V_{th}$ (see FIG. 2, waveform I, legend 60) TELD 20 gate-cathode voltage is lowered sufficiently that high field domain formation commences within TELD 20. The high field domain formation commences at a delay $t_1 \times t_2$ after input voltage $V_{th}$ is reached. Time delay $t_1$, occasioned by the delay through device 20, is $100 \cdot 10^{-12}$ seconds or less. Time delay $t_2$ is caused by the rise time of the RC circuit formed by the resistor 30 and a capacitor 64 (illustrated in phantom). Capacitor 64 consists of the capacitance inherent in an imperfect inductor 32 and the input capacitance between gate and source of FET 36. Time $t_2$ is $200 \cdot 10^{-12}$ seconds or less.

Thus, within about $300 \cdot 10^{-12}$ or less seconds after the input signal exceeds $V_{th}$, the first of a series of high field domains occurs within TELD 20. These domains form at the anode edge 62 of the gate and travel to the anode of TELD 20. When one high field domain has travelled from gate (G) to anode (A), a new high field domain is formed at the gate and the process repeats. Waveform II of FIG. 2 does not show discrete voltage pulses due to individual domains being formed because the RC time constant of the TELD's cathode circuit causes an average voltage to persist with a smaller time varying voltage due to domains.

During the time that high field domains are being (serially) formed, relative to when they are not being formed, the effective impedance of TELD 20 increases and therefore the current through TELD 20 and thus through the network comprising resistor 30 and capacitor 64 decreases producing a lower voltage at terminal II. This voltage decrease occurs with the time constant associated with the resistor 30 and capacitor 64 network. The output voltage at terminal II oscillates with a period equal to the rate of field domain formation. The lowered output voltage at terminal II is reflected as an increase in output voltage at terminal III as applied to load 50. This condition in which a relatively high voltage is produced at terminal III will be hereinafter known as the "ON" state. Following time delay $t_3$ after the time the signal at terminal II begins to decrease in value, occasioned by delay in FET 36, the drain terminal of FET 36 begins to increase in value. After a further delay $t_4$ occasioned by the rise time $t_2$ and in addition the time constant of the drain circuit due to various capacitances to ground (not shown), the signal at the drain (D) of FET 36 reaches its maximum value. In one exemplary embodiment, $t_3 < 100 \cdot 10^{-12}$ seconds while $t_4$ is on the order of $400 \cdot 10^{-12}$ seconds. Thus, the total elapsed time from the point in time that the input signal at terminal I exceeds $V_{th}$ until FET 36 has produced a change in output signal level is illustrated in FIG. 2 as $t_5$ which is about $600 \cdot 10^{-12}$ seconds or substantially less than one nanosecond.

The circuit of FIG. 1 remains in the ON state even after the input signal at terminal I returns below $V_{th}$ for an extended period such as occurs at point 65. Such a circuit exhibits the property of being "monostable" in that following a suitable momentary input pulse, the output terminal remains in the ON state for a period of time and then turns to the OFF state. The input pulse must be above $V_{th}$ for a period of time at least equal to the domain formation time, which is typically much less than 100 ps. The duration of the ON state depends upon the operating point at TELD 20 and thus upon bias voltages $V_1$ and $V_2$ and further upon the values chosen for inductor 32, capacitor 64, and resistor 30, as will be described.

The cathode-to-ground circuit of TELD 20 responds to the current drop of TELD 20 with two different time constants. The first time constant is due to the resistor 30 and capacitor 64. This time constant is chosen to be larger than the domain formation time of TELD 20 in order that serial domain formation can occur after the input signal to the gate has gone below threshold value. The second time constant is determined by inductor 32 and resistor 30 and this time constant is large in comparison to the first time constant. The combination of resistor 30 and inductor 32 limit the maximum duration of the ON state since the TELD 20 cathode voltage must return to ground potential in a time determined by inductor 32 and resistor 30. In one working embodiment, the ON state is maintained for 10 nanoseconds.

By reducing the value of inductor 32 and reducing the bias voltage $V_1$, the circuit of FIG. 1 is made to exhibit thresholding properties with a short duration of ON state. Voltage $V_1$, however, must not be reduced so much as to not permit the domain sustaining voltage difference to exist between the anode and cathode of TELD 20 when a high field domain is triggered. Thus, this circuit exhibits monostable operation.

Figure 3:
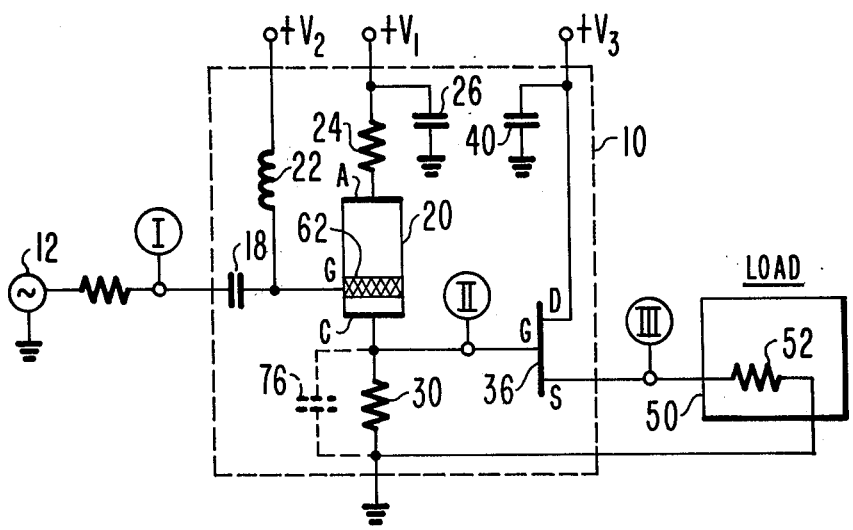
FIG. 3 is a bistable threshold gate circuit in accordance with the present invention.

An alternative threshold gate circuit exhibiting bistable properties is illustrated in FIG. 3 to which attention is now directed. The threshold circuit of FIG. 3 is similar to that of FIG. 1. Elements similar to those in FIG. 1 are identically identified. There are, however, several differences. In particular, the drain of FET 36 is coupled directly to bias source $V_3$ while the FET's source is coupled directly to the load 50 which, again, comprises suitably a low impedance resistor 52. No inductor is present between TELD 20 and ground. It should be noted that the waveforms of FIG. 2 apply to the circuit of FIG. 3 except that the waveform produced at terminal III of FIG. 3 circuit is inverted and D.C. shifted from the waveform which is illustrated. The circuit of FIG. 3 when compared with the circuit of FIG. 1, desirably has the capability of remaining "latched" in the ON state until a signal is applied to return it to the OFF state. This feature will be explained in further detail below.

Unlike the circuit of FIG. 1, however, the circuit of FIG. 3 provides no voltage gain through the FET 36. Further, bias voltage $V_3$ must be turned on before bias voltage $V_1$ is turned on to prevent permanent damage to FET 36. The initial operation of the circuit of FIG. 3 is identical to that of FIG. 1 in that when the input signal at terminal I exceeds $V_{th}$, TELD 20 begins to form high field domains causing reduced currents through resistor 30 and the consequent change at output terminal III. Latching in the circuit of FIG. 3 is caused by the combined effects of resistor 30, the value of bias voltages $V_1$ and $V_2$ and by capacitor 76, illustrated in phantom which is primarily due to the capacitance of FET 36 between gate and source. The circuit of FIG. 3 is bistable in that once the input signal at terminal I has exceeded value $V_{th}$ even if the returns to some value below $V_{th}$ for an extended period of time, the TELD 20 will remain in its high field domain formation state indefinitely. This action occurs in the same manner as in the circuit of FIG. 1 except that in that case the TELD is forced out of the latched state because inductor 32 causes the TELD's cathode to return to earth ground eventually. The circuit of FIG. 3 contains no inductor and thus will not change state. To reset the circuit of FIG. 3 to a condition in which high field domains are not being formed in TELD 20, a positive pulse is typically applied to the gate, such as described by Upadhyayula, et al. in a report entitled "Microwave Shift Register," Contract No. N00014-75-C-0100, Office of Naval Research, Feb. 12, 1976.

In one working embodiment, TELD 20 is a planar device constructed with an n-type gallium arsenide (GaAs) layer grown on a semi-insulating substrate of gallium arsenide material. It has:

$n \times 1 \geq 10^{13}/cm^2$ and $n \times d \geq 10^{12}/cm^2$ where n is the donor density in the epitaxial layer, l is the cathode-anode separation and d is the epitaxial layer thickness. A choice of $n = 1 \times 10^{16}/cm^3$, $l = 35 \mu m$, $d = 2 \mu m$ and anode to gate spacing of $28\mu$ should produce 25 to 40 percent of current drop in GaAs devices with low defect density, low trapping center density and a large low-field mobility.

In one working embodiment of the circuit of FIG. 1, the values of the various elements are as follows:

| | |
|---|---|
| Capacitor 4 100pF | Resistor 24 300 ohms |
| Capacitor 18 50 pF | Resistor 30 100 ohms |
| Capacitor 26 100 pF | Resistor 52 50 ohms |
| Capacitor 64 2 pF | $V_1 = 18V$. |
| Inductor 22 3.3$\mu$H | $V_2 = +1.5V$ |
| Inductor 32 3.3$\mu$H | $V_3 = 5V$ |
| Inductor 38 3.3$\mu$H | MESFET 36 RCA - MTC -T825 with $G_m = .035$ mS |

The threshold properties of the circuits of FIGS. 1 and 3 make them useful in situations in which a fast output pulse is required following receipt of an input signal above threshold value. Such threshold circuits are useful in determining the time of arrival of an input signal. A plurality of the circuits can also be arranged to provide an analog-to-digital converter, especially in the type employing high data rates such as in excess of 1 GHz. A number of such threshold circuits can be built with threshold voltage values differing by as small as 50 mV by changing the bias values used for $V_2$.

It will be recognized that the gate terminal of FET 36 may be coupled to either the cathode terminal of TELD 20 as illustrated in FIG. 1 or 3 or it may be coupled to the anode terminal of TELD 20. In the latter configuration, provision will be made to maintain a reversed biased on the gate with respect to the source of FET 36.

With FET 36 coupled to TELD 20 anode, the output waveform of the circuit of FIG. 1 is inverted in polarity from voltage waveform III of FIG. 2 whereas the output waveform of circuit in FIG. 3 is the same polarity as voltage III of FIG. 2. The change in output polarity is desirable for some applications.

What is claimed is:

1. A threshold gate circuit comprising in combination:
   a transferred electron logic device (TELD) having an anode terminal to which a bias signal is applied, a cathode terminal at which an output signal is produced and a gate terminal to which an input signal is applied, said TELD, when biased having a quiescent mode and a domain formation mode;
   means coupled between said anode and cathode terminals for biasing said TELD at a voltage below its threshold voltage;
   an active device having transconductance value $G_m$ coupled in cascade with said TELD at one of said anode and cathode terminal for producing an output signal having one value when said TELD is in its domain forming mode and having a different value when said TELD is in its quiescent mode, said signal being adapted to drive a load of resistance $R_L$ where $G_m > 1 \div R_L$;
   means coupled to said gate terminal and adapted to receive an input signal which if below a predetermined threshold value causes said TELD to remain in its quiescent mode and if above said threshold value causes said TELD to produce said domain formation whereby an input signal less than said threshold value corresponds to an output signal at said one value and an input signal above said threshold value corresponds to an output signal at said different value.

2. The threshold gate circuit of claim 1 wherein said active device is a field effect transistor having drain, source, and gate terminals, said gate terminal being coupled to said cathode terminal of said TELD, said load being coupled between said drain and source terminals.

3. The combination as set forth in claim 2 further including means directly coupling said TELD cathode terminal and said field effect transistor gate terminal.

4. The combination as set forth in claim 1 wherein said bias means is coupled resistively to said anode terminal and inductively to said cathode terminal.

5. The combination as set forth in claim 1 further including biasing means coupled to said gate terminal for biasing said gate to a substantially fixed D.C. level while providing substantially an infinite impedance between said means coupled to said gate terminal and said bias means.

6. The combination as set forth in claim 5 wherein there is further included inductive means coupling said biasing means to said gate terminal.

7. The combination as set forth in claim 1 further including a second bias source means wherein said active device is a field effect transistor having drain, source, and gate terminals, said gate terminal being coupled to said cathode terminal, said second bias source means being inductively coupled between said drain and source and said load being coupled to said drain terminal.

8. The combination as set forth in claim 1 wherein said load includes first and second terminals and further including a second bias source means and wherein said active device is a field effect transistor having drain, source, and gate terminals, said gate terminal being coupled to said cathode of said TELD, said second bias means being coupled across said drain terminal and said first terminal of said load, said second terminal of said load being coupled to said source terminal.

9. The combination as set forth in claim 4 wherein there is further included resistive means and capacitive means in parallel with said inductive means the combination of said capacitive means and said resistive means in accordance with the time constant thereof, causing said domain forming mode, once begun, to continue after said input signal has gone below said predetermined value, the combination of said inductor and said parallel resistor in accordance with the time constant thereof limiting the time said TELD remains in said domain forming mode after said input signal has gone below said predetermined value.

10. The threshold gate circuit of claim 1 wherein said active device is a field effect transistor having drain, source, and gate terminals, said gate terminal being coupled to said anode terminal of said TELD, said load being coupled between said drain and source terminals.

11. The combination as set forth in claim 10 further including means directly coupling said TELD anode terminal and said field effect transistor gate terminal.

12. The combination as set forth in claim 1 further including a second bias source means wherein said active device is a field effect transistor having drain, source, and gate terminals, said gate terminal being coupled to said anode terminal said second bias source means being inductively coupled between said drain and source and said load being coupled to said drain terminal.

13. The combination as set forth in claim 1 wherein said load includes first and second terminals and further including a second bias source means and wherein said active device is a field effect transistor having drain, source, and gate terminals, said gate terminal being coupled to said anode of said TELD, said second bias means being coupled across said drain terminal and said first terminal of said load, said second terminal of said load being coupled to said source terminal.

* * * * *